United States Patent [19]

Baliga et al.

[11] Patent Number: 4,948,976

[45] Date of Patent: Aug. 14, 1990

[54] MULTI-WAVELENGTH BAND INFRARED DETECTOR

[75] Inventors: Shankar B. Baliga, Hauppauge; Adishwar L. Jain, Hicksville; John A. Little, Northport; Martin R. Rost, Islip Terrace, all of N.Y.

[73] Assignee: Servo Corporation of America, Hicksville, N.Y.

[21] Appl. No.: 308,409

[22] Filed: Feb. 9, 1989

[51] Int. Cl.$^5$ .......................... H01L 49/02; G01J 5/20
[52] U.S. Cl. .......................... 250/370.06; 250/338.4; 250/339
[58] Field of Search .................. 250/339, 370.06, 226, 250/349, 338.1, 338.4

[56] References Cited

U.S. PATENT DOCUMENTS

| | | |
|---|---|---|
| 3,107,302 | 10/1963 | Coleman .............................. 250/339 |
| 3,743,995 | 7/1973 | Riedl et al. ...................... 250/370.06 |
| 3,962,578 | 6/1976 | Roschen .............................. 250/339 |
| 4,117,329 | 9/1978 | Kruer et al. ...................... 250/338.1 |
| 4,126,732 | 11/1978 | Schoolar et al. ...................... 357/52 |
| 4,224,520 | 9/1980 | Greene et al. .................... 250/338.4 |
| 4,651,001 | 3/1987 | Harada et al. ...................... 250/339 |

Primary Examiner—Carolyn E. Fields
Attorney, Agent, or Firm—Kane, Dalsimer, Sullivan, Kurucz, Levy, Eisele and Richard

[57] ABSTRACT

An infrared detector capable of obtaining coincident fields of view of infrared radiation of different wavelengths is provided. The detector comprises a sandwich-type construction including PbSe and PbS photoconductive film layers.

7 Claims, 2 Drawing Sheets

MULTI-WAVELENGTH BAND INFRARED DETECTOR

BACKGROUND OF THE INVENTION

The present invention relates to infrared sensors and in particular to an improved detector capable of detecting infrared in both the 1-3 um and 3-5 um spectral ranges.

Lead salt photoconductive sensors have been widely used in military applications since World War II. Such sensors are used for target sensing and/or tracking as well as in proximity fuses for various types of weapons. In most such applications superior results are obtained with multi-spectral detection as distinct from single spectral detection. The reason for this is that the use of two wavelengths reduces the effects of counter measures, increases accuracy, improves target detectability and decreases false alarms.

There are several techniques that are available for forming an image from scanning one or more detector arrays in the focal plane of a seeker. The high angular resolution that is necessary for target detection and tracking require that the infrared detector be disposed in a high density array. System sensitivity is increased in proportion to the square root of the number of array elements. Accordingly it is desireable to maximize the number of elements to improve sensitivity. However, since heretofore separate elements were required for the different spectral regions the number of elements in the arrays for each of the regions was necessarily half the total number of elements. Thus the sensitivity in each spectral region was heretofore reduced by attempts to increase the spectral range.

In view of the above, it is the principal object of the present invention to provide an improved infrared detector capable of detecting infrared energy within different spectral ranges.

A further object is to provide such a detector with a coincident field of view for the different spectral ranges.

A further object is to provide such a detector which differentiates infrared energy within the 1-3 um and 3-5 um spectral ranges.

A still further object is to provide such a detector which can be consistently reproduced and at a relatively modest cost.

SUMMARY OF THE INVENTION

The above and other beneficial objects and advantages are attained in accordance with the present invention by providing an improved infrared detector having multiple photoconductive layers that are sensitive in different spectral ranges. The detector comprises an insulating substrate, a layer of PbSe deposited on the substrate, and a layer of PbS deposited over the PbSe. An insulating layer such as $SiO_2$ is provided between the PbSe and PbS layers so as to eliminate the possibility of cross talk. Since the PbSe salt tends to lose Se, a layer of a stoichiometric salt is preferably provided over the PbSe layer to replenish any lost Se as well as sealing the PbSe layer. The PbS layer converts infrared energy in the 1-3 um spectral range into electrical energy while passing infrared radiation outside that range to the PbSe layer. Such a sandwich structure provides a coincident field of view for both PbS and PbSe detectors.

DETAILED DESCRIPTION OF THE PREFERRED EMBODIMENT

Figure 2:
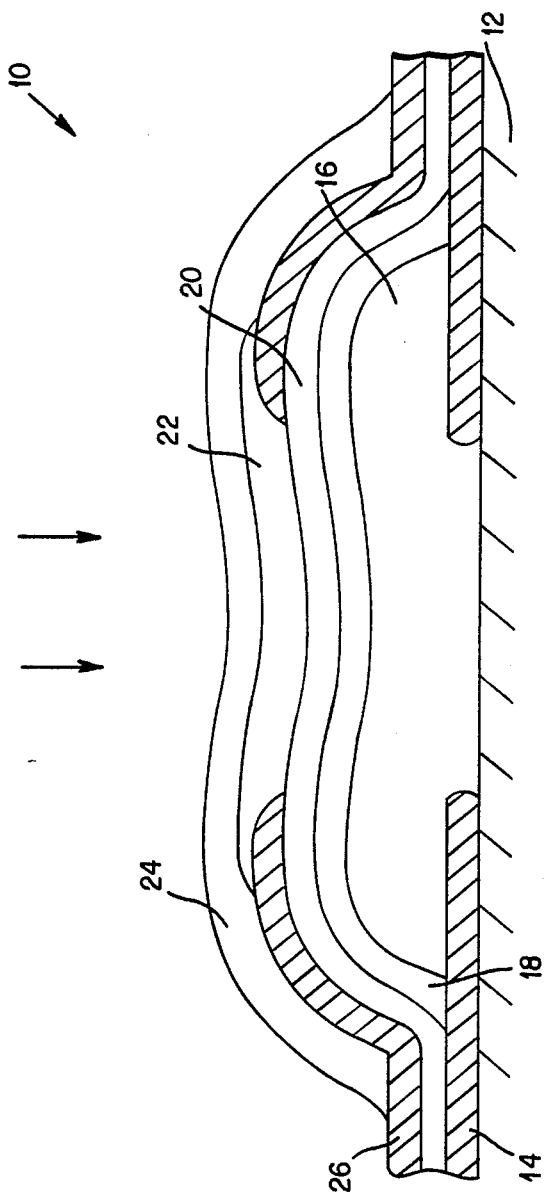

Reference is now made to the drawings and to FIG. 2 in particular wherein a highly exaggerated infrared detector in accordance with the present invention is depicted. The detector 10 comprises a substrate 12 formed of an insulating material such as quartz, sapphire glass, Pyrex or the like. A pair of electrodes 14 are deposited on substrate 12 and a thin film PbSe (lead selenide) photoconductive layer 16 is deposited over the substrate 12 engaging electrodes 14. The PbSe layer serves to detect infrared radiation in the 3-5 micron wavelength range. A layer 18 of arsenic triselenide ($As_2Se_3$) is provided over the PbSe layer 16. The $As_2Se_3$ layer 18 performs the dual function of sealing the PbSe layer 16 and balancing the stoichiometry of the PbSe by replenishing any deficiency in selenium. The $As_2Se_3$ layer 18 is transparent to infrared radiation in the 3-5 micron wavelength range.

The $As_2Se_3$ layer 18 is covered by a layer of an infrared (3-5 micron) transmissive glass 20 which, for example, may be formed of silicon monoxide (SiO). This layer permits transmission of the 3-5 micron wavelength infrared radiation to the PbSe detector while, at the same time, serving as a substrate for a layer of PbS (lead sulfide). The glass layer 20 should be matched to the refractive index of the $As_2Se_3$ layer 18 to permit maximum radiation transmission to the PbSe detector.

The glass layer 20 is covered by a thin film PbS photoconductive layer 22. This layer serves as a detector of infrared radiation in the 1-3 micron range. Layer 22 also prevents the 1-3 micron radiation from reaching the PbSe photoconductive detector. A sealing layer 24 of arsenic trisulfide ($As_2S_3$) is provided over the PbS layer. The sealing layer 24 helps control and stabilize the responsivity of the PbS detector layer 22. Gold contacts 26 are provided for the PbS layer.

Figure 1:
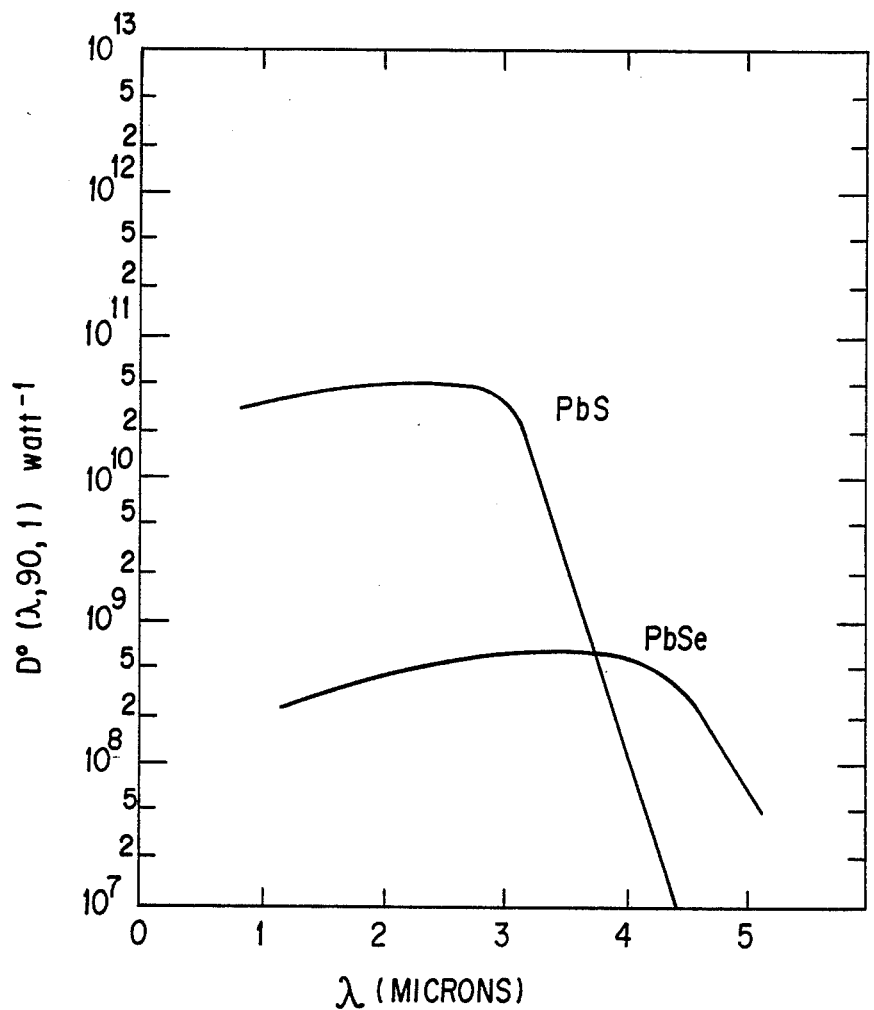
FIG. 1 is an exaggerated side elevational sectional view of a detector in accordance with the present invention; and, FIG. 2 is a graph of the spectral response of PbS and PbSe photoconductive layers at room temperature.

Reference is now made to FIG. 1 wherein the spectral response of PbS and PbSe detectors (at room temperature) is set forth. As can be seen, the response of the PbS layer is generally flat between 1-3 microns and thereafter falls off sharply. The spectral response of PbSe is less intense than that of PbS and extends between approximately 1-5 microns before dropping off. Since the PbS layer absorbs infrared radiation of wavelengths between 1-3 microns (and converts the same to electrical energy) only infrared radiation within the 3-5 micron wavelength band is transmitted to the PbSe layer for conversion to electrical energy. Thus electrical signals representative of the 3-5 micron wavelength range and 1-3 micron wavelength range appear respectively on sets of electrodes 14 and 26.

In practice the various layers may be formed by any convenient method such as evaporation, chemical deposition or sputtering. In practice it has been found preferable to form the PbSe layer by chemical deposition as a result of reacting selenourea and lead acetate. The layers of arsenic glasses may be formed by evaporation and the SiO and PbS layers may be formed by sputtering or evaporation.

Thus in accordance with the above, the aforementioned objectives are effectively attained.

Having thus described the invention, what is claimed is:

1. An infrared detector comprising a first thin film detector layer of PbSe responsive to infrared radiation in a first wavelength band, a second thin film detector layer of PbS overlying said first detector layer and responsive to infrared radiation in a second wavelength band and transparent to infrared radiation in said first wavelength band and contacts connected to each of said detector layers.

2. The invention in accordance with claim 1 further comprising a layer of arsenic triselenide immediately overlying said PbSe layer.

3. The invention in accordance with claim 2 further comprising a transmissive glass layer immediately overlying said arsenic triselenide layer, said glass layer having a refractive index matched to that of said arsenic triselenide layer.

4. The invention in accordance with claim 3 wherein said transmissive glass layer is formed of silicon monoxide.

5. The invention in accordance with claim 3 wherein said transmissive glass layer forms a substrate for said PbS film.

6. The invention in accordance with claim 1 further comprising a sealing layer overlying said PbS layer.

7. The invention in accordance with claim 6 wherein said sealing layer comprises arsenic trisulfide.

* * * * *